United States Patent
Wang et al.

(10) Patent No.: US 10,275,559 B2
(45) Date of Patent: Apr. 30, 2019

(54) METHOD FOR LEGALIZING MIXED-CELL HEIGHT STANDARD CELLS OF IC

(71) Applicant: Taiwan Semiconductor Manufacturing Co., Ltd., Hsinchu (TW)

(72) Inventors: Chao-Hung Wang, Taipei (TW); Yen-Yi Wu, Taipei (TW); Shih-Chun Chen, Taipei (TW); Yao-Wen Chang, Taipei (TW); Meng-Kai Hsu, Xinfeng Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 218 days.

(21) Appl. No.: 15/355,431

(22) Filed: Nov. 18, 2016

(65) Prior Publication Data
US 2018/0144083 A1    May 24, 2018

(51) Int. Cl.
*G06F 17/50* (2006.01)
(52) U.S. Cl.
CPC ...... *G06F 17/5072* (2013.01); *G06F 17/5077* (2013.01); *G06F 17/5081* (2013.01)
(58) Field of Classification Search
CPC ............. G06F 17/5072; G06F 17/5077; G06F 17/5081
USPC ............... 716/122, 123, 124, 125, 129, 131; 703/15
See application file for complete search history.

(56) References Cited

U.S. PATENT DOCUMENTS

| | | | |
|---|---|---|---|
| 4,577,276 A * | 3/1986 | Dunlop | G06F 17/5072 716/123 |
| 4,903,214 A * | 2/1990 | Hiwatashi | H01L 21/768 257/E21.575 |
| 5,943,243 A * | 8/1999 | Sherlekar | G06F 17/5072 716/122 |
| 7,737,472 B2 * | 6/2010 | Kondo | H01L 27/11807 257/204 |
| 8,421,205 B2 | 4/2013 | Yang | |
| 8,661,389 B2 | 2/2014 | Chern et al. | |
| 8,698,205 B2 | 4/2014 | Tzeng et al. | |
| 8,826,212 B2 | 9/2014 | Yeh et al. | |
| 8,836,141 B2 | 9/2014 | Chi et al. | |
| 8,875,076 B2 | 10/2014 | Lin et al. | |
| 9,147,029 B2 | 9/2015 | Ke et al. | |
| 9,336,348 B2 | 5/2016 | Hsieh et al. | |
| 9,401,258 B2 | 7/2016 | Hung et al. | |

(Continued)

*Primary Examiner* — Phallaka Kik
(74) *Attorney, Agent, or Firm* — McClure, Qualey & Rodack, LLP

(57) ABSTRACT

A method for legalizing mixed-cell height standard cells of an IC is provided. A target standard cell is obtained in a window of a global placement. The target standard cell has a first area overlapping a first standard cell located in a first row of the window, and a second area overlapping a second standard cell located in a second row of the window. The target standard cell and the first standard cell are moved until the target standard cell does not overlap the first standard cell in the first row of the window. The target standard cell and the first standard cell are clustered as a first cluster when the target standard cell does not overlap the first standard cell. The first cluster is moved away from the second standard cell in the second row until the second standard cell does not overlap the first cluster.

20 Claims, 11 Drawing Sheets

(56) References Cited

U.S. PATENT DOCUMENTS

| | | | |
|---|---|---|---|
| 9,412,700 B2 | 8/2016 | Hsieh et al. | |
| 9,431,381 B2 | 8/2016 | Hsieh et al. | |
| 9,477,803 B2 | 10/2016 | Wang et al. | |
| 2008/0066041 A1* | 3/2008 | Kahng | G06F 17/5072 257/798 |
| 2009/0113370 A1* | 4/2009 | Yoshinaga | G06F 17/5072 716/119 |
| 2009/0267124 A1* | 10/2009 | Bosshard | G06F 17/5072 257/296 |
| 2010/0162184 A1* | 6/2010 | Penzes | G06F 17/505 716/120 |
| 2010/0162187 A1* | 6/2010 | Penzes | G06F 17/5068 716/122 |
| 2010/0169851 A1* | 7/2010 | Kumagai | H01L 23/5286 716/121 |
| 2013/0059238 A1* | 3/2013 | Kurjanowicz | G11C 17/16 430/5 |
| 2013/0061194 A1* | 3/2013 | Handa | G06F 17/5068 716/122 |
| 2014/0264924 A1 | 9/2014 | Yu et al. | |
| 2014/0282289 A1 | 9/2014 | Hsu et al. | |
| 2015/0279453 A1 | 10/2015 | Fujiwara et al. | |
| 2015/0318241 A1 | 11/2015 | Chang et al. | |
| 2015/0347659 A1 | 12/2015 | Chiang et al. | |
| 2015/0357279 A1 | 12/2015 | Fujiwara et al. | |
| 2015/0370946 A1 | 12/2015 | Yang et al. | |
| 2016/0012169 A1 | 1/2016 | Chiang et al. | |
| 2016/0013271 A1 | 1/2016 | Chiang et al. | |
| 2016/0079162 A1 | 3/2016 | Hsieh et al. | |
| 2016/0126232 A1 | 5/2016 | Liu et al. | |
| 2016/0147927 A1 | 5/2016 | Chiang et al. | |
| 2016/0267204 A1* | 9/2016 | Bales | G06F 17/505 |
| 2016/0276331 A1 | 9/2016 | Liaw | |

* cited by examiner

US 10,275,559 B2

METHOD FOR LEGALIZING MIXED-CELL HEIGHT STANDARD CELLS OF IC

BACKGROUND

In recent years, the development process of such integrated circuits (ICs) as super large scale integrated circuits (LSIs) generally utilizes computer assisted design (CAD). According to such a CAD-based development process, abstract circuit data, which corresponds to functions of an integrated circuit to be developed, is defined by using a so-called hardware description language (HDL), and the defined circuit is used to form a concrete circuit structure to be mounted on a chip.

Before the IC chips are implemented, the placements and the layout areas of the IC chips are considered first, and then the die size of each IC chip can be determined. Furthermore, the die size will affect the manufacturing cost of the IC chip.

Therefore, it is desirable to optimize the layout area and die size of the IC chip.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
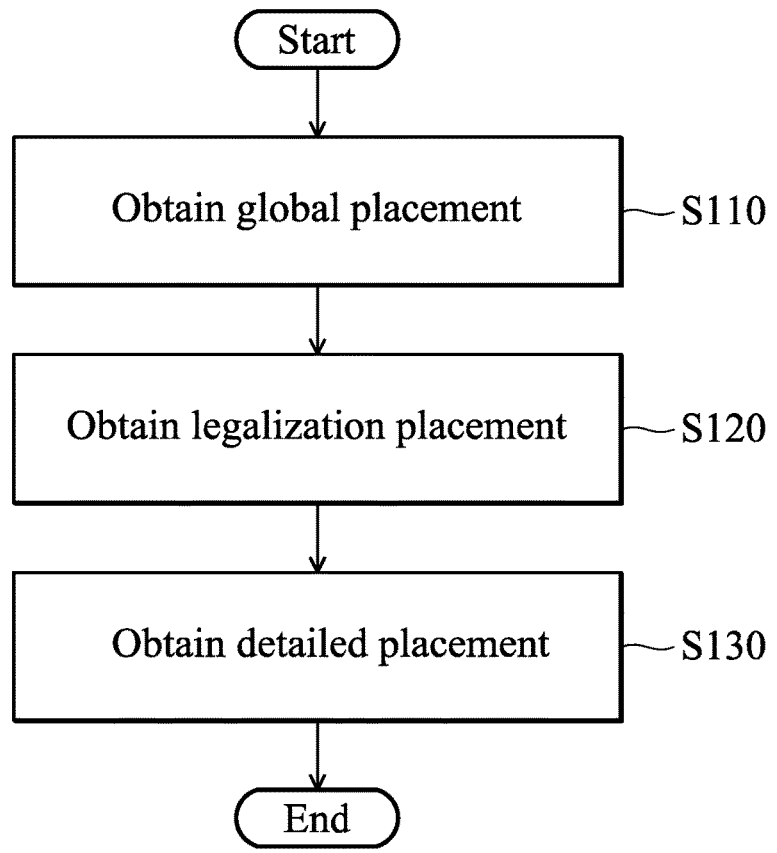
FIG. 1A shows a flow chart illustrating a placement procedure in the design process of an integrated circuit (IC), in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1A shows a flow chart illustrating a placement procedure in a design process of an integrated circuit (IC), in accordance with some embodiments of the disclosure. In some embodiments, the flow chart of FIG. 1 is performed by a computer capable of operating an electronic design automation (EDA) tool.

Figure 1B:
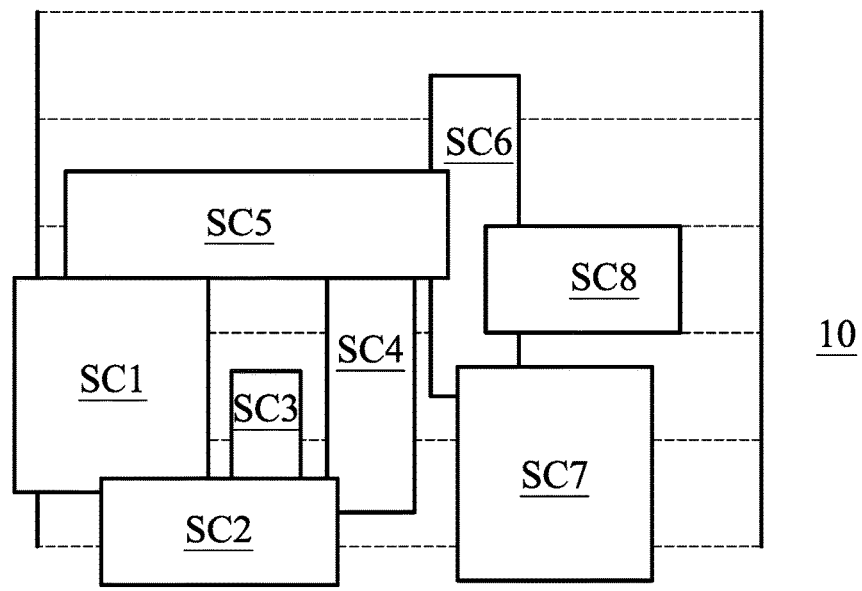
FIG. 1B shows an example illustrating a global placement.

In step S110, a global placement (GP) within a chip area of the IC is obtained according to standard cells of the IC. In the global placement, standard cells of the IC are evenly distributed while minimizing a target cost (e.g. wirelength). As shown in FIG. 1B, a plurality of standard cells SC1-SC8 are placed in a global placement 10. In order to simplify the description, VDD/VSS power rails are omitted in the global placement 10. In general, VDD power rails and VSS power rails are mutually interlaced in a placement of IC. In some embodiments, the standard cells of the IC are obtained by synthesizing a register-transfer-level (RTL) code describing the function performed by the IC.

Figure 1C:
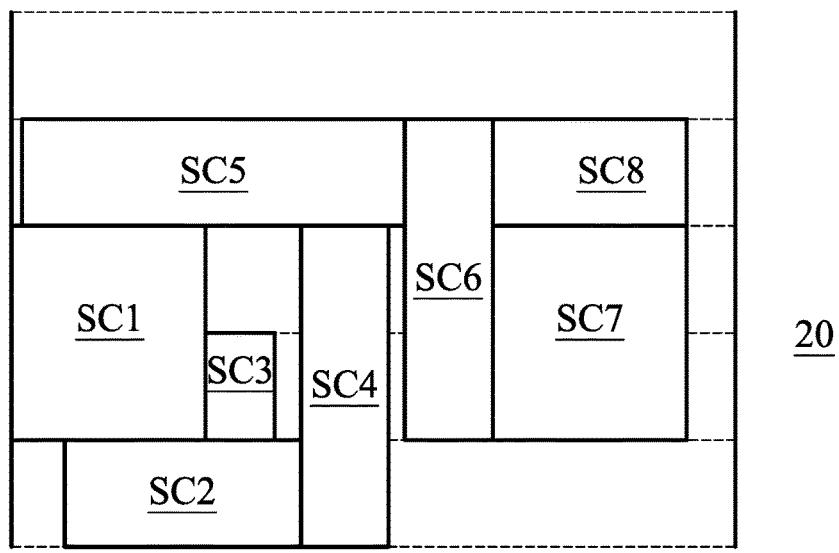
FIG. 1C shows an example illustrating a legalized placement.

In step S120, a legalization procedure is performed to place the standard cells into a plurality of rows and remove all overlaps among the standard cells, so as to provide a legalized (LG) placement of the IC. As shown in FIG. 1C, the standard cells SC1-SC8 are placed in a legalized placement 20, and the standard cells SC1-SC8 are aligned in rows and between the VDD/VSS power rails. Furthermore, no standard cell overlaps other standard cells in the legalized placement 20.

In step S130, a refinement procedure is performed to refine the legalized placement and then a detailed placement (DP) is obtained for the IC.

According to the detailed placement, routing paths of the standard cells are obtained, and then it is checked whether there is any congestion in the detailed placement according to the routing paths. If there is no congestion in the detailed placement, the IC is implemented according to the detailed placement and routing paths. If there is congestion in the detailed placement, the chip area of the IC must be increased to handle the congestion, and then the placement procedure is performed again so as to generate a new detailed placement for the IC.

Figure 2:
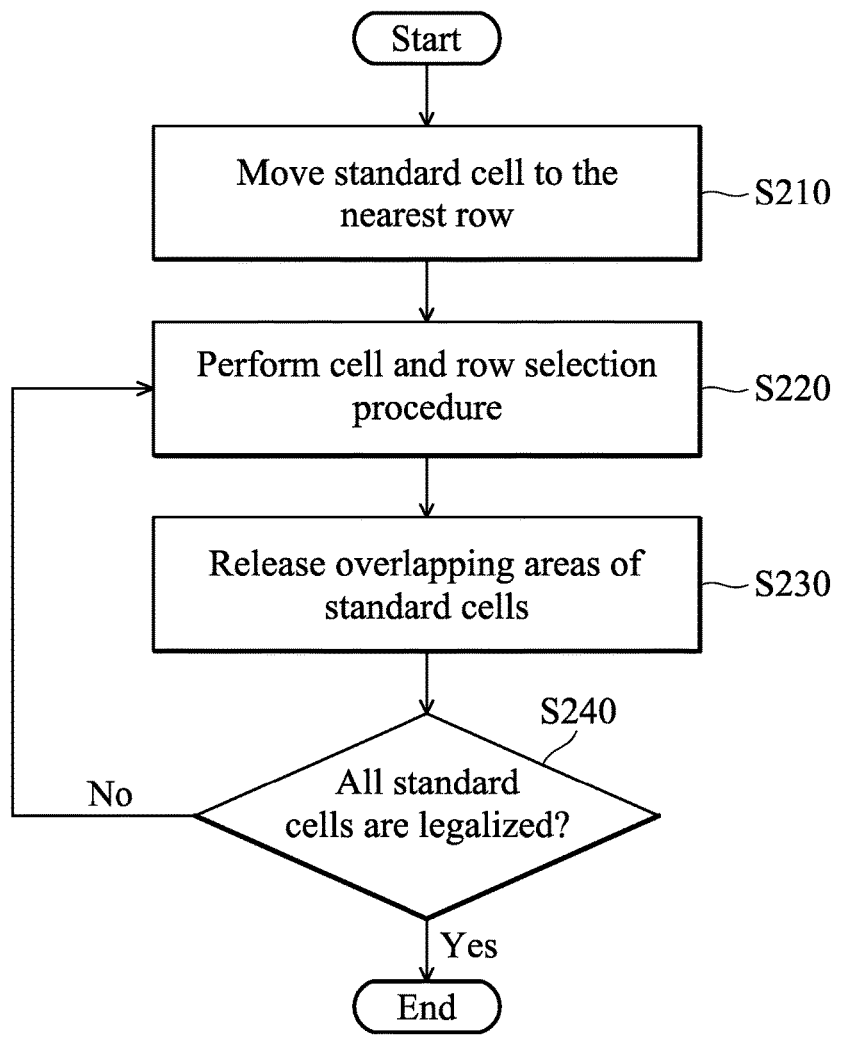
FIG. 2 shows a method for legalizing mixed-cell height standard cells of an integrated circuit (IC), in accordance with some embodiments of the disclosure.

FIG. 2 shows a method for legalizing mixed-cell height standard cells of an integrated circuit (IC), in accordance with some embodiments of the disclosure. In some embodiments, the method of FIG. 2 is performed by a computer capable of operating an electronic design automation (EDA) tool.

In step S210, each standard cell of the IC is moved to the nearest row in a global placement of the IC, and a displacement value of the moved standard cell is obtained. As described above, standard cells of the IC are evenly distributed while minimizing a target cost (e.g. wirelength) in the global placement, as shown in FIG. 1B. In some embodiments, the positions of the standard cells are determined according to a placement constraint corresponding to circuit functions of the IC.

In step S220, a cell and row selection procedure is performed to divide the global placement of the IC into a plurality of windows according to the displacement values of the moved standard cells and dead spaces corresponding to the moved standard cells. In the global placement, the standard cells include a plurality of single-height cells and a plurality of multiple-row-height (or multiple-height) cells, i.e. the standard cells have different cell heights. For example, a portion of standard cells are single-height cells, and another portion of standard cells are double-height cells. Furthermore, each window includes a plurality of standard cells located in a plurality of rows.

In step S230, a multi-place-row method is performed on each target standard cell, to release the areas of the target standard cell overlapping other standard cells in at least one row of the window in each window. In some embodiments, a cell height of the target standard cell is different from the overlapping standard cells. Furthermore, in some embodiments, the cell height of the target standard cell is equal to the overlapping standard cells.

In step S240, it is determined whether all standard cells are legalized, i.e. no standard cell overlaps other standard cell in each window. If all standard cells are legalized, a legalized placement is obtained according to the windows of the global placement, as shown in FIG. 1C. If any standard cell is not legalized, the cell and row selection procedure of step S220 is performed again.

In some embodiments, when the standard cells are legalized in each window, the total displacement tD is obtained according to the following equations:

$$tD = \sum_{i=1}^{n} (|xo_i - xl_i| + |yo_i - yl_i| + \alpha \times D_i),$$

wherein i represents the $i^{th}$ standard cell in the window, $xo_i$ represents a horizontal coordinate of the $i^{th}$ standard cell in the global placement, and $yo_i$ represents a vertical coordinate of the $i^{th}$ standard cell in the global placement. Furthermore, $xl_i$ represents a legal horizontal coordinate of the $i^{th}$ standard cell in the legalized placement, and $yl_i$ represents a legal vertical coordinate of the $i^{th}$ standard cell in the legalized placement. Moreover, $\alpha$ represents a user-defined parameter, and $D_i$ represents a dead space generated or reduced by a target standard cell. The dead space is a space which cannot be used to place any standard cell, i.e. the dead space is incapable of placing the standard cell. Furthermore, $D_i$<0 means the dead space can be reduced.

In some embodiments, each window has a minimum total displacement tD in the legalized placement. Thus, the total area of the all dead spaces can be decreased.

Figure 3:
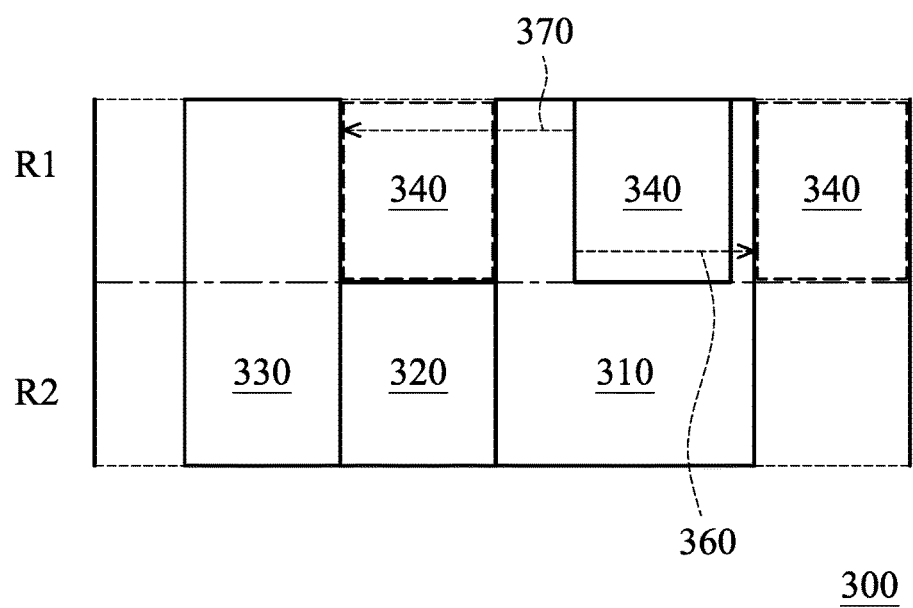
FIG. 3 shows an example illustrating various dead spaces $D_i$ corresponding to a standard cell to be moved in a window.

FIG. 3 shows an example illustrating various dead spaces $D_i$ corresponding to a standard cell 340 to be moved in a window 300. In the window, the rows R1 and R2 are adjacent to each other. A standard cell 310 is moved to the nearest rows R1 and R2 from its position (not shown), a standard cell 320 is moved to the nearest row R2 from its position (not shown), and a standard cell 330 is moved to the nearest rows R1 and R2 from its position (not shown). Furthermore, the standard cell 340 is moved to the nearest row R1 from its position (not shown). However, the standard cell 340 overlaps the standard cell 310 in the row R1. In the window 300, if the standard cell 340 is moved to the right side of the standard cell 310 (as shown in label 360), the dead space $D_i$ is equal to 0, i.e. $D_i$=0. Conversely, if the standard cell 340 is moved to the left side of the standard cell 310 (as shown in label 370) and placed into an interval between the standard cells 330 and 310, the dead space $D_i$ is decreased, i.e. $D_i$<0.

Figure 4A:
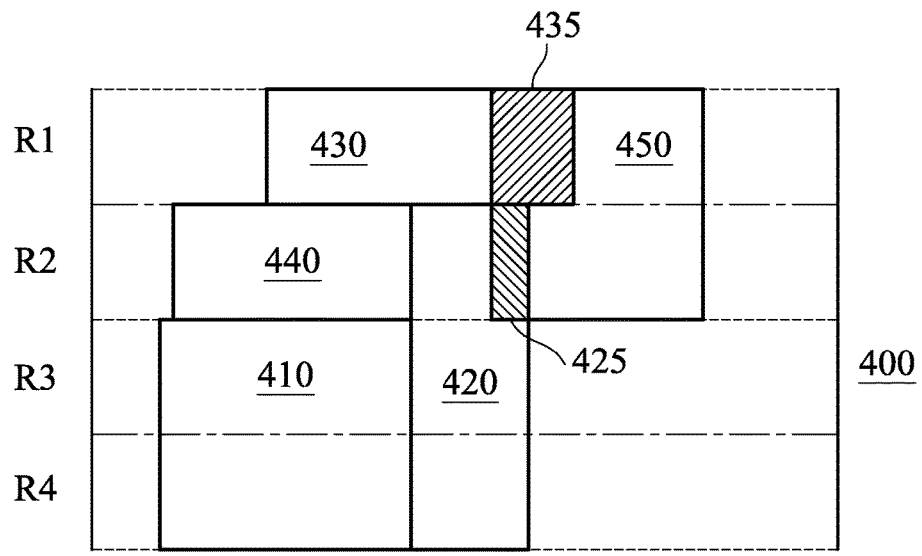
FIGS. 4A, 4B and 4C show a window illustrating a multi-place-row method of FIG. 2, in accordance with some embodiments of the disclosure.
Figure 4B:
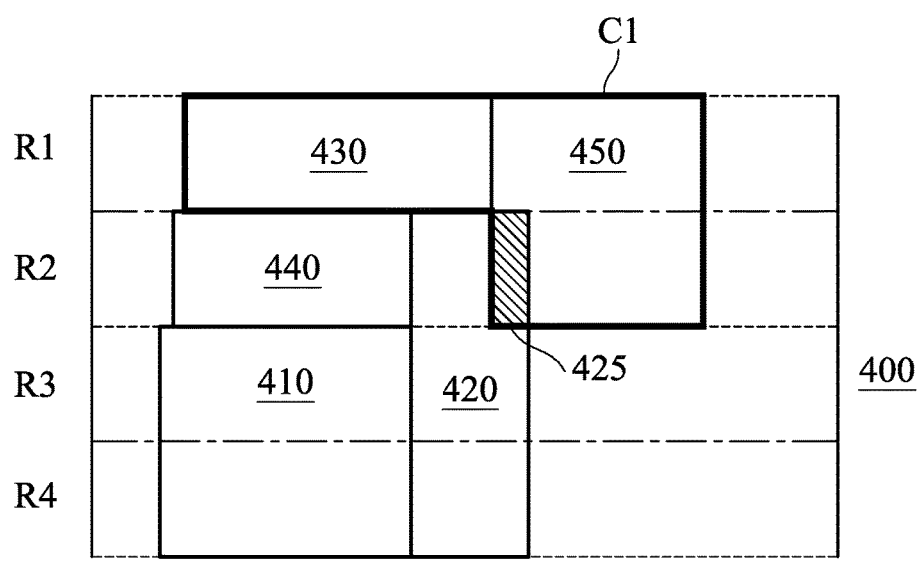
Figure 4C:
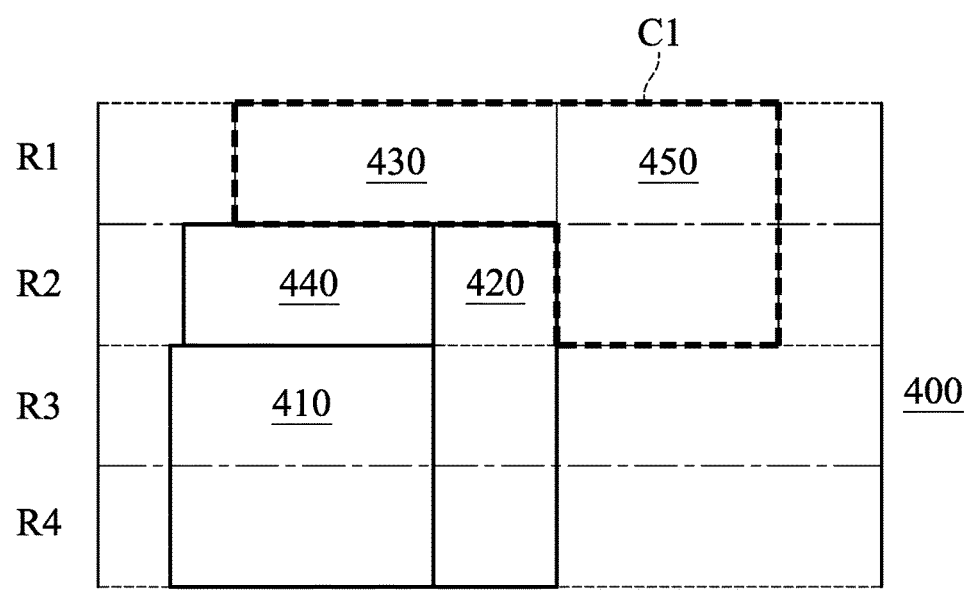

FIGS. 4A, 4B and 4C show a window 400 illustrating a multi-place-row method of FIG. 2, in accordance with some embodiments of the disclosure. As described above, the standard cells 410-450 are moved to the nearest row from the positions of a global placement.

In the window 400 of FIG. 4A, the standard cell 410 is a double-height cell located in the rows R3 and R4. The standard cell 420 is a triple-height cell located in the rows R2-R4. The standard cell 430 is a single-height cell located in the row R1. The standard cell 440 is a single-height cell located in the row R2. The standard cell 450 is a double-height cell located in the rows R1 and R2.

The standard cells 430 and 450 have an overlapping area 435 in the row R1, i.e. the standard cell 450 has a portion of area (e.g. 435) overlapping the standard cell 430. Furthermore, the standard cells 420 and 450 have an overlapping area 425 in the row R2, i.e. the standard cell 450 has another portion of area (e.g. 425) overlapping the standard cell 420. Because the total overlapping area of the standard cell 450 (e.g. the sum of the overlapping area 435 of the row R1 and the overlapping area 425 of the row R2) is larger than that of the other standard cells 410-440, the standard cell 450 is selected as a target standard cell.

For a target standard cell, a maximum overlapping area located in a single row is selected to be released first. For example, the overlapping area 435 of the row R1 is greater than the overlapping area 425 of the row R1. Thus, the standard cell 430 and/or the target standard cell 450 are moved until the target standard cell 450 does not overlap the standard cell 430 in the row R1.

In FIG. 4B, the standard cell 430 is moved away from the target standard cell 450 until no overlapping area 435 exists in the row R1. When the target standard cell 450 does not overlap the standard cell 430 in the row R1, the target standard cell 450 and the standard cell 430 are clustered as a cluster C1. Furthermore, the cluster C1 can be simulated into a target cluster.

For a target cluster, a maximum overlapping area located in a single row is selected to release first. In the embodiment, the target cluster C1 and the standard cell 420 have the overlapping area 425 in the row R2. Thus, the standard cell 420 and/or the target cluster C1 are moved until the target cluster C1 does not overlap the standard cell 420 in the row R2.

In FIG. 4C, the target cluster C1 is moved away from the standard cell 420. When the target cluster C1 does not overlap the standard cell 420 in the row R2, the target cluster C1 is declustered to obtain the standard cells 430 and 450. Thus, according to the locations of the standard cells 410-450 of the window 400, a legalized placement is obtained. As described above, a detailed placement is obtained by refining the legalized placement, and then subsequent processes are performed to implement the IC.

Figure 5A:
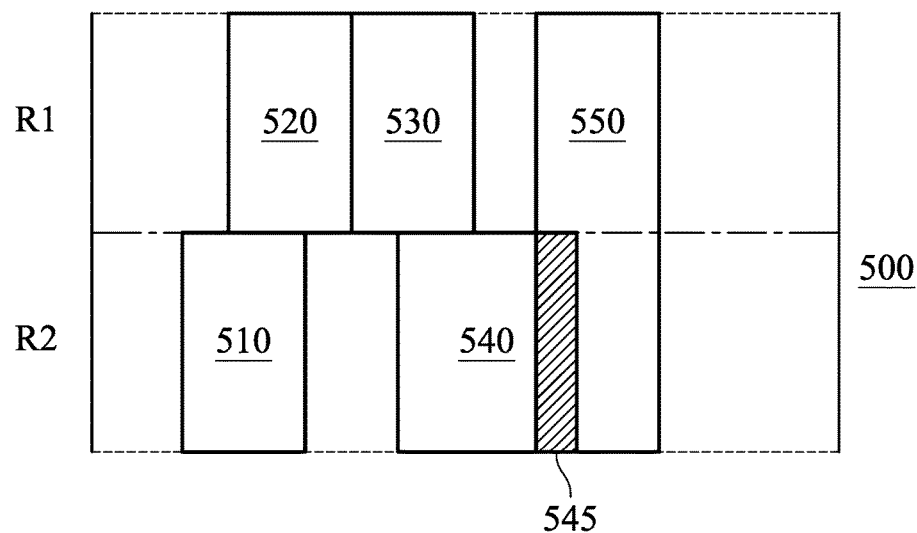
FIGS. 5A and 5B show a window illustrating a multi-place-row method of FIG. 2, in accordance with some embodiments of the disclosure.
Figure 5B:
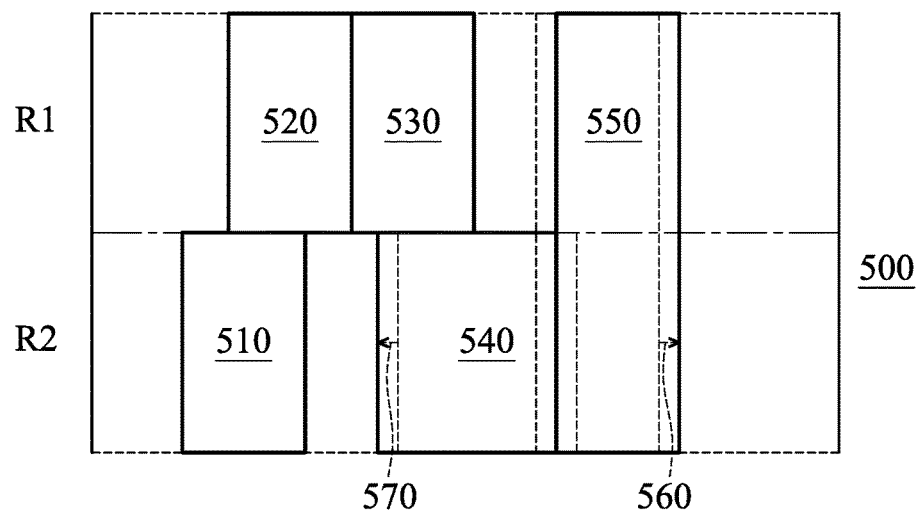

FIGS. 5A and 5B show a window 500 illustrating a multi-place-row method of FIG. 2, in accordance with some embodiments of the disclosure. As described above, the standard cells 510-550 are moved to the nearest row from the positions of a global placement.

In the window 500 of FIG. 5A, the standard cell 510 is a single-height cell located in the row R2. The standard cell 520 is a single-height cell located in the row R1. The standard cell 530 is a single-height cell located in the row R1. The standard cell 540 is a single-height cell located in the row R2. The standard cell 550 is a double-height cell located in the rows R1 and R2.

The standard cells 540 and 550 have an overlapping area 545 in the row R2, i.e. the standard cell 550 has a portion of an area (e.g. 545) overlapping the standard cell 550. Furthermore, due to the cell height of the standard cell 550 being higher than that of the standard cell 540, the standard cell 550 is selected as a target standard cell. Thus, the standard cell 540 and/or the target standard cell 550 are moved until no overlapping area 545 exists in the row R2, i.e. the target standard cell 550 does not overlap the standard cell 540 in the row R2.

In FIG. 5B, the standard cell 540 is moved to the standard cell 510 in the row R2 (as shown in label 570), and the target standard cell 550 is moved away from the standard cell 510 in the row R2 (as shown in label 560). When the target standard cell 550 does not overlap the standard cell 540 in the row R2, a legalized placement is obtained according to the locations of the standard cells 510-550 of the window 500. As described above, a detailed placement is obtained by refining the legalized placement, and then subsequent processes are performed to implement the IC.

Figure 6A:
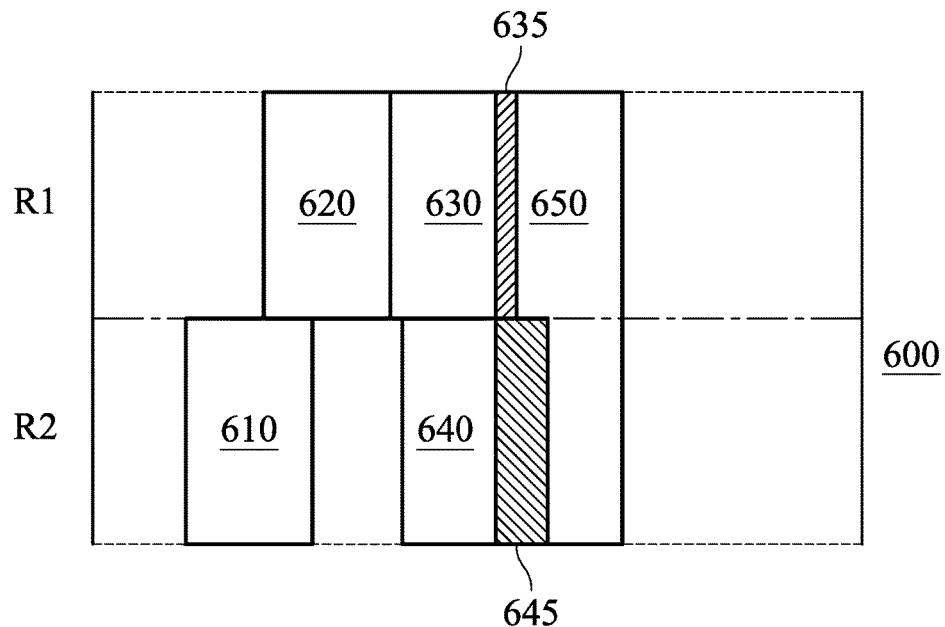
FIGS. 6A and 6B show a window illustrating a multi-place-row method of FIG. 2, in accordance with some embodiments of the disclosure.
Figure 6B:
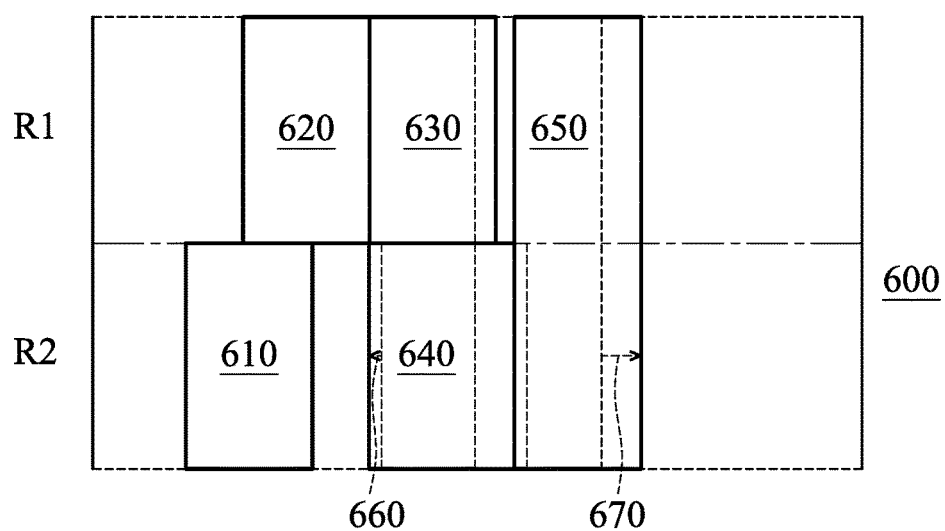

FIGS. 6A and 6B show a window 600 illustrating a multi-place-row method of FIG. 2, in accordance with some embodiments of the disclosure. As described above, the standard cells 610-650 are moved to the nearest row from the positions of a global placement.

In the window 600 of FIG. 6A, the standard cell 610 is a single-height cell located in the row R2. The standard cell 620 is a single-height cell located in the row R1. The standard cell 630 is a single-height cell located in the row R1. The standard cell 640 is a single-height cell located in the row R2. The standard cell 650 is a double-height cell located in the rows R1 and R2.

The standard cells 630 and 650 have an overlapping area 635 in the row R1, and the standard cells 640 and 650 have an overlapping area 645 in the row R2. Due to the cell height of the standard cell 650 being higher than that of the standard cells 630 and 640, the standard cell 650 is selected as a target standard cell.

For a target standard cell, a maximum overlapping area located in a single row is selected to release first. For example, the overlapping area 645 of the row R2 is greater than the overlapping area 635 of the row R1. Thus, the standard cell 640 and/or the target standard cell 650 are moved until the target standard cell 650 does not overlap the standard cell 640 in the row R2.

In FIG. 6B, the standard cell 640 is moved to the standard cell 610 in the row R2 (as shown in label 660), and the target standard cell 650 is moved away from the standard cell 610 in the row R2 (as shown in label 670). When the target standard cell 650 does not overlap the standard cell 640 in the row R2, i.e. no overlapping area 645 exists in the row R2, the target standard cell 650 also does not overlap the standard cell 630 in the row R1, i.e. no overlapping area 635 exists in the row R1. Thus, a legalized placement is obtained according to the locations of the standard cells 610-650 of the window 600. As described above, a detailed placement is obtained by refining the legalized placement, and then subsequent processes are performed to implement the IC.

FIGS. 7A-7D show a window 700 illustrating a multi-place-row method of FIG. 2, in accordance with some embodiments of the disclosure. As described above, the standard cells 710-750 are moved to the nearest row from the positions of a global placement.

Figure 7A:
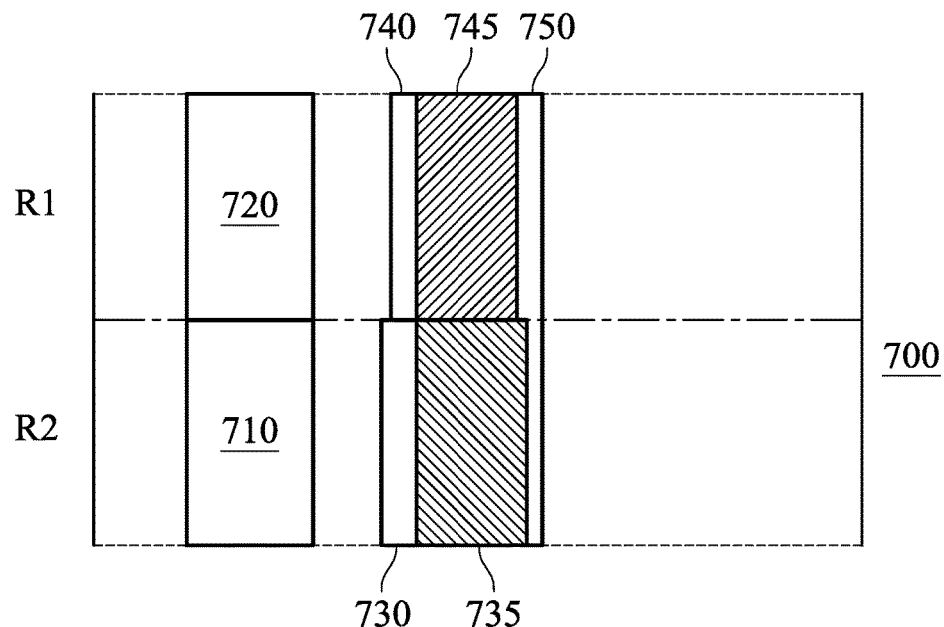
FIGS. 7A-7D show a window illustrating a multi-place-row method of FIG. 2, in accordance with some embodiments of the disclosure.

In the window 700 of FIG. 7A, the standard cell 710 is a single-height cell located in the row R2. The standard cell 720 is a single-height cell located in the row R1. The standard cell 730 is a single-height cell located in the row R2. The standard cell 740 is a single-height cell located in the row R1. The standard cell 750 is a double-height cell located in the rows R1 and R2.

The standard cells 730 and 750 have an overlapping area 735 in the row R2, and the standard cells 740 and 750 have an overlapping area 745 in the row R1. Due to the cell height of the standard cell 750 being higher than that of the standard cells 730 and 740, the standard cell 750 is selected as a target standard cell.

For a target standard cell, a maximum overlapping area located in a single row is selected to be released first. For example, the overlapping area 735 of the row R2 is greater than the overlapping area 745 of the row R1. Thus, the standard cell 730 and/or the target standard cell 750 are moved until the target standard cell 750 does not overlap the standard cell 730 in the row R2, i.e. no overlapping area 735 exists in the row R2.

Figure 7B:
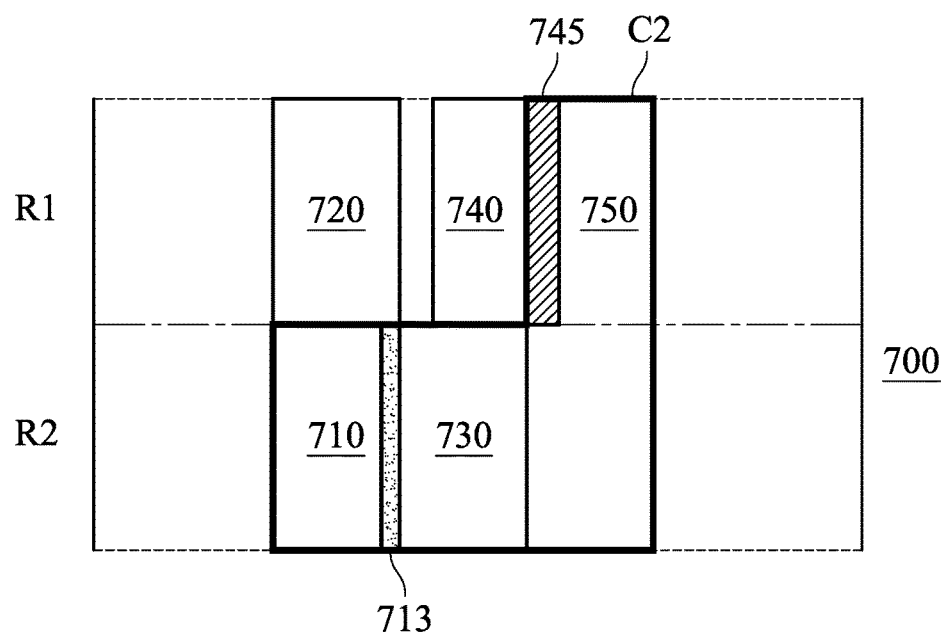

In FIG. 7B, the standard cell 730 is moved to the standard cell 710 in the row R2, and the target standard cell 750 is moved away from the standard cell 710 in the row R2. However, the target standard cell 750 does not overlap the standard cell 730 in the row R2, but the standard cell 730 overlaps the standard cell 710, wherein the standard cells 710 and 730 have an overlapping area 713 in the row R2. Thus, the target standard cell 750, the standard cell 730 and the standard cell 710 are clustered as a cluster C2. Furthermore, the cluster C2 can be simulated into a target cluster.

For a target cluster, a maximum overlapping area located in a single row is selected for release first. In the embodiment, the target cluster C2 and the standard cell 740 have the overlapping area 745 in the row R1. Thus, the standard cell 740 and/or the target cluster C2 are moved until the target cluster C2 does not overlap the standard cell 740 in the row R1.

Figure 7C:
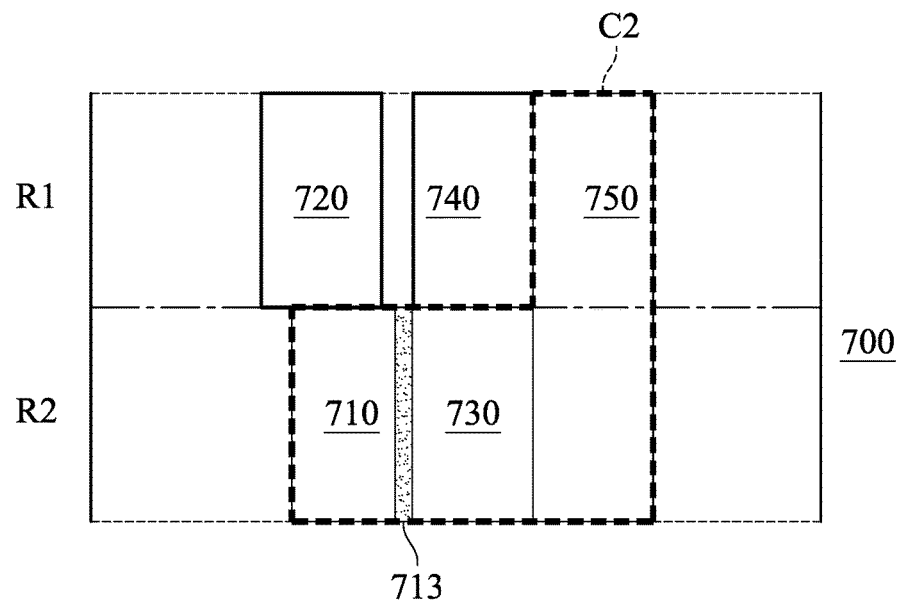

In FIG. 7C, the target cluster C2 is moved away from the standard cell 740. When the target cluster C2 does not overlap the standard cell 740 in the row R1, no overlapping area 745 exists in the row R1, and the target cluster C2 is declustered to obtain the standard cells 710, 730 and 750.

Figure 7D:
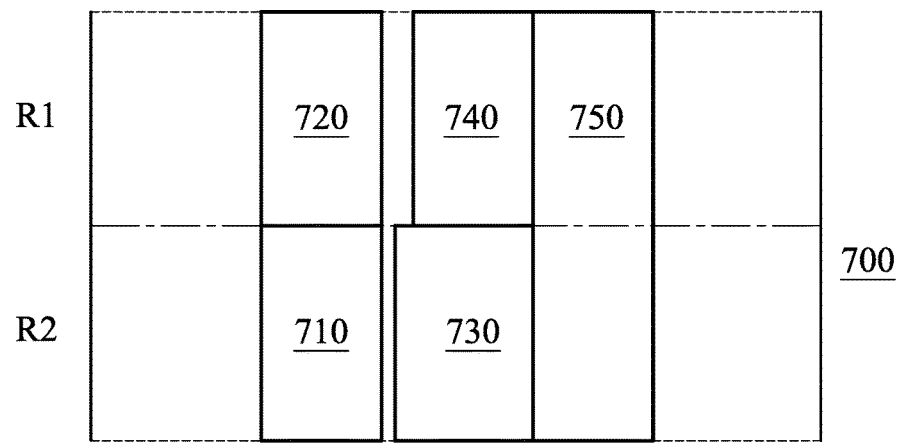

In FIG. 7D, after the target standard cell 750 does not overlap the other standard cells 710-740, the standard cell 710 is moved into its position of FIG. 7A. Thus, no overlapping area exists in the window 700. Therefore, according to the locations of the standard cells 710-750 of the window 700, a legalized placement is obtained. As described above, a detailed placement is obtained by refining the legalized placement, and then subsequent processes are performed to implement the IC.

Figure 8:
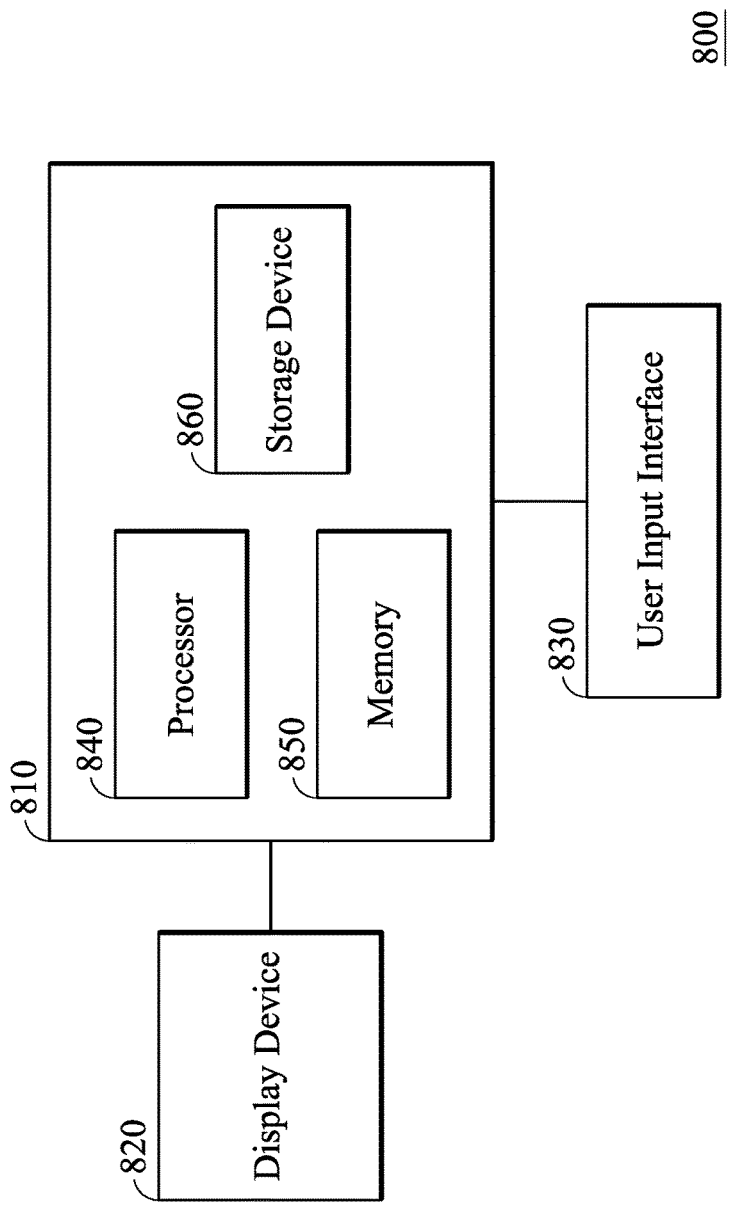
FIG. 8 shows a computer system 800, in accordance with some embodiments of the disclosure.

FIG. 8 shows a computer system 800, in accordance with some embodiments of the disclosure. The computer system 800 includes a computer 810, a display device 820 and a user input interface 830, wherein the computer 810 includes a processor 840, a memory 850, and a storage device 860. The computer 810 is coupled to the display device 820 and the user input interface 830, wherein the computer 810 is capable of operating an electronic design automation (EDA) tool. Furthermore, the computer 810 is capable of receiving the information regarding the global placement of the IC and displaying the global placement, the legalized placement, and detailed placement on the display device 820. In some embodiments, the display device 820 is a GUI for the computer 810. Furthermore, the display device 820 and the user input interface 830 can be implemented in the computer 810. The user input interface 830 may be a keyboard, a mouse and so on. In the computer 810, the storage device 860 can store the operating systems (OSs), applications, and data that include input required by the applications and/or output generated by applications. The processor 840 of the computer 810 can perform one or more operations (either automatically or with user input) in any method that is implicitly or explicitly described in this disclosure. Furthermore, during operation, the processor 840 can load the applications of the storage device 860 into the memory 850, and then the applications can be used by a user to create, view, and/or edit the related placement for IC design.

Embodiments of legalizing mixed-cell height standard cells of an IC are provided. A global placement is divided into a plurality of windows according to positions of a plurality of standard cells and dead spaces. By clustering and declustering the related standard cells and a target standard cell, each overlapping area of the target standard cell can be released. In some embodiments, the target standard cell has a higher cell height. According to the embodiments, after legalizing the mixed-cell height standard cells, no violation is present in the placement of the IC. Furthermore, row-based legalization and multi-height cell legalization can be considered simultaneously.

In some embodiments, a method for legalizing mixed-cell height standard cells of an integrated circuit (IC) is provided. A global placement of the IC is obtained, wherein a plurality of standard cells of the IC are placed in the global placement. A first target standard cell is obtained in a window of the global placement, wherein the first target standard cell has a first area overlapping a first standard cell located in a first row of the window, and a second area overlapping a second standard cell located in a second row of the window, wherein the first area is greater than the second area. The first target standard cell and the first standard cell are moved in the first row until the first target standard cell does not overlap the first standard cell in the first row of the window. The first target standard cell and the first standard cell are clustered as a first cluster when the first target standard cell does not overlap the first standard cell in the first row of the window. The first cluster is moved away from the second standard cell in the second row until the second standard cell does not overlap the first cluster in the second row of the window.

In some embodiments, a method for legalizing mixed-cell height standard cells of an IC is provided. A global placement of the IC is obtained, wherein a plurality of standard cells of the IC are placed in the global placement. Each of the standard cells is moved from a position to the nearest row in the global placement. A displacement value of each of the moved standard cells is obtained in the global placement. The global placement of the IC is divided into a plurality of windows according to the displacement values of the moved standard cells in each of the windows and a dead space corresponding to each of the moved standard cells in each of the windows. All overlapping areas among the standard cells of each of the windows are removed to obtain a detailed placement. The standard cells have different cell heights in each of the windows.

In some embodiments, a method for legalizing mixed-cell height standard cells of an IC is provided. A global placement of the IC is obtained, wherein a plurality of standard cells of the IC are placed in the global placement. A plurality of specific standard cells are obtained from the standard cells in a window of the global placement, wherein each of the specific standard cells has a plurality of areas overlapping the standard cells located in different rows in the window. A first target standard cell is selected from the specific standard cells, wherein the first target standard cell has a maximum overlapping area of the sum of the areas. A first standard cell is moved away from the first target standard cell in a first row until the first target standard cell does not overlap the first standard cell in the first row of the window, wherein the area overlapping the first standard cell is max for the first target standard cell. The first target standard cell and the first standard cell are clustered as a first cluster when the first target standard cell does not overlap the first standard cell in the first row of the window. The first cluster is moved away from a second standard cell in a second row until the second standard cell does not overlap the first target standard cell of the first cluster in the second row of the window, wherein the first row is different from the second row.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for legalizing mixed-cell height standard cells of an integrated circuit (IC), comprising:
   obtaining a global placement of the IC, wherein a plurality of standard cells of the IC are placed in the global placement;
   obtaining a first target standard cell in a window of the global placement, wherein the first target standard cell has a first area overlapping a first standard cell located in a first row of the window, and a second area overlapping a second standard cell located in a second row of the window, wherein the first area is greater than the second area;
   moving the first target standard cell and the first standard cell in the first row until the first target standard cell does not overlap the first standard cell in the first row of the window;
   clustering the first target standard cell and the first standard cell as a first cluster when the first target standard cell does not overlap the first standard cell in the first row of the window;
   moving the first cluster away from the second standard cell in the second row until the second standard cell does not overlap the first cluster in the second row of the window, so as to obtain a detailed placement; and
   manufacturing the IC according to the detailed placement.

2. The method as claimed in claim 1, further comprising:
   declustering the first cluster to obtain the first standard cell and the first target standard cell when the second standard cell does not overlap the first cluster in the second row of the window; and
   providing the detailed placement according to the window of the global placement.

3. The method as claimed in claim 1, wherein the first row is adjacent to the second row in the window of the global placement.

4. The method as claimed in claim 1, wherein the step of obtaining the first target standard cell in the window of the global placement further comprises:
- moving each of the standard cells from a position to a nearest row in the global placement;
- obtaining a displacement value of each of the moved standard cells; and
- determining the window of the global placement according to the displacement values of the moved standard cells in the window and a dead space corresponding to each of the moved standard cells in the window,
- wherein the dead space is incapable of placing the standard cell.

5. The method as claimed in claim 1, further comprising:
- obtaining a second target standard cell in the window of the global placement, wherein the second target standard cell has a third area overlapping a third standard cell located in a third row of the window, wherein a cell height of the second target standard cell is higher than that of the third standard cell; and
- moving the second target standard cell and the third standard cell in the third row until the second target standard cell does not overlap the third standard cell in the third row of the window.

6. The method as claimed in claim 1, further comprising:
- determining whether the first cluster overlaps a fourth standard cell located in a first position of the first row of the window;
- clustering the first cluster and the fourth standard cell as a second cluster when the first cluster overlaps the fourth standard cell in the first row of the window; and
- moving the second cluster away from the second standard cell in the second row until the second standard cell does not overlap the second cluster in the second row of the window.

7. The method as claimed in claim 6, further comprising:
- declustering the second cluster to obtain the first cluster and the fourth standard cell when the second standard cell does not overlap the second cluster in the second row of the window; and
- moving the fourth standard cell to the first position in the first row of the window.

8. A method for legalizing mixed-cell height standard cells of an integrated circuit (IC), comprising:
- obtaining a global placement of the IC, wherein a plurality of standard cells of the IC are placed in the global placement;
- obtaining a plurality of specific standard cells from the standard cells in a window of the global placement, wherein each of the specific standard cells has a plurality of areas overlapping the standard cells located in different rows in the window;
- selecting a first target standard cell from the specific standard cells, wherein the first target standard cell has a maximum overlapping area of the sum of the areas;
- moving a first standard cell away from the first target standard cell in a first row until the first target standard cell does not overlap the first standard cell in the first row of the window, wherein the area overlapping the first standard cell is max for the first target standard cell;
- clustering the first target standard cell and the first standard cell as a first cluster when the first target standard cell does not overlap the first standard cell in the first row of the window;
- moving the first cluster away from a second standard cell in a second row until the second standard cell does not overlap the first target standard cell of the first cluster in the second row of the window, wherein the first row is different from the second row, so as to obtain a detailed placement; and
- manufacturing the IC according to the detailed placement.

9. The method as claimed in claim 8, further comprising:
- declustering the first cluster to obtain the first standard cell and the first target standard cell when the second standard cell does not overlap the first cluster in the second row of the window; and
- providing the detailed placement according to the window of the global placement.

10. The method as claimed in claim 8, wherein the step of obtaining the specific standard cells from the standard cells in the window of the global placement further comprises:
- moving each of the standard cells from a position to a nearest row in the global placement;
- obtaining a displacement value of each of the moved standard cells; and
- determining the window of the global placement according to the displacement values of the moved standard cells in the window and a dead space corresponding to each of the moved standard cells in the window,
- wherein the dead space is incapable of placing the standard cell.

11. The method as claimed in claim 8, further comprising:
- obtaining a second target standard cell in the window of the global placement, wherein the second target standard cell has a third area overlapping a third standard cell located in a third row of the window, wherein a cell height of the second target standard cell is higher than that of the third standard cell; and
- moving the second target standard cell and the third standard cell in the third row until the second target standard cell does not overlap the third standard cell in the third row of the window.

12. The method as claimed in claim 8, further comprising:
- determining whether the first cluster overlaps a fourth standard cell located in a first position of the first row of the window;
- clustering the first cluster and the fourth standard cell as a second cluster when the first cluster overlaps the fourth standard cell in the first row of the window; and
- moving the second cluster away from the second standard cell in the second row until the second standard cell does not overlap the second cluster in the second row of the window.

13. The method as claimed in claim 12, further comprising:
- declustering the second cluster to obtain the first cluster and the fourth standard cell when the second standard cell does not overlap the second cluster in the second row of the window; and
- moving the fourth standard cell to the first position in the first row of the window.

14. A method for legalizing mixed-cell height standard cells of an integrated circuit (IC), comprising:
- obtaining a global placement of the IC, wherein a plurality of standard cells of the IC are placed in the global placement;
- obtaining a first target standard cell in a window of the global placement, wherein the first target standard cell has a first area overlapping a first standard cell located in a first row of the window, and a second area overlapping a second standard cell located in a second row of the window, wherein the first area is greater than the second area;

moving the first target standard cell and the first standard cell in the first row until the first target standard cell does not overlap the first standard cell in the first row of the window;

clustering the first target standard cell and the first standard cell as a first cluster when the first target standard cell does not overlap the first standard cell in the first row of the window;

determining whether the first cluster overlaps a third standard cell located in a first position of the first row of the window;

moving the first cluster away from the second standard cell in the second row when the first cluster does not overlap the third standard cell in the first row of the window, until the second standard cell does not overlap the first cluster in the second row of the window, so as to obtain a detailed placement; and manufacturing the IC according to the detailed placement.

15. The method as claimed in claim 14, further comprising:

declustering the first cluster to obtain the first standard cell and the first target standard cell when the second standard cell does not overlap the first cluster in the second row of the window; and providing the detailed placement according to the window of the global placement.

16. The method as claimed in claim 14, wherein the first row is adjacent to the second row in the window of the global placement.

17. The method as claimed in claim 14, wherein the step of obtaining the first target standard cell in the window of the global placement further comprises:

moving each of the standard cells from a position to a nearest row in the global placement;

obtaining a displacement value of each of the moved standard cells; and determining the window of the global placement according to the displacement values of the moved standard cells in the window and a dead space corresponding to each of the moved standard cells in the window, wherein the dead space is incapable of placing the standard cell.

18. The method as claimed in claim 14, further comprising:

obtaining a second target standard cell in the window of the global placement, wherein the second target standard cell has a third area overlapping a fourth standard cell located in a third row of the window, wherein a cell height of the second target standard cell is higher than that of the fourth standard cell; and moving the second target standard cell and the fourth standard cell in the third row until the second target standard cell does not overlap the fourth standard cell in the third row of the window.

19. The method as claimed in claim 14, further comprising:

clustering the first cluster and the fourth standard cell as a second cluster when the first cluster overlaps the third standard cell in the first row of the window; and moving the second cluster away from the second standard cell in the second row until the second standard cell does not overlap the second cluster in the second row of the window, wherein cell height of the first target standard cell is different from that of the first, second and third standard cells.

20. The method as claimed in claim 19, further comprising:

declustering the second cluster to obtain the first cluster and the third standard cell when the second standard cell does not overlap the second cluster in the second row of the window; and moving the fourth standard cell to the first position in the first row of the window.

* * * * *